United States Patent
Zhao et al.

(10) Patent No.: US 9,368,962 B2
(45) Date of Patent: Jun. 14, 2016

(54) ELECTROSTATIC PROTECTION CIRCUIT, DISPLAY DEVICE AND ELECTROSTATIC PROTECTION METHOD

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Tingting Zhao, Beijing (CN); Xiangyang Xu, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 63 days.

(21) Appl. No.: 14/368,861

(22) PCT Filed: Apr. 24, 2013

(86) PCT No.: PCT/CN2013/074638
§ 371 (c)(1),
(2) Date: Jun. 26, 2014

(87) PCT Pub. No.: WO2014/127580
PCT Pub. Date: Aug. 28, 2014

(65) Prior Publication Data
US 2015/0263516 A1  Sep. 17, 2015

(30) Foreign Application Priority Data

Feb. 22, 2013  (CN) .......................... 2013 1 0057443

(51) Int. Cl.
*H02H 9/04* (2006.01)
*H01L 27/12* (2006.01)
(Continued)

(52) U.S. Cl.
CPC ......... *H02H 9/044* (2013.01); *G02F 1/136204* (2013.01); *H01L 27/0266* (2013.01); *H01L 27/124* (2013.01); *H02H 9/046* (2013.01)

(58) Field of Classification Search
CPC ......... H02H 9/044; H02H 9/046; H02H 9/04; H02H 9/041; H02H 9/045; G02F 1/136204
See application file for complete search history.

(56) References Cited

U.S. PATENT DOCUMENTS 6,043,971 A * 3/2000 Song ................. G02F 1/136204
                                                  349/40
6,445,427 B1* 9/2002 Lee ................... G02F 1/136204
                                                  349/40
(Continued)

FOREIGN PATENT DOCUMENTS

CN    101078845 A    11/2007
CN    202332851 U     7/2012
CN    202550507 U    11/2012

OTHER PUBLICATIONS

Second Chinese Office Action dated Apr. 13, 2015; Appln. No. 201310057443.X.
(Continued)

*Primary Examiner* — Stephen W Jackson
*Assistant Examiner* — Christopher Clark
(74) *Attorney, Agent, or Firm* — Ladas & Parry LLP

(57) ABSTRACT

An electrostatic protection circuit, a display device and an electrostatic protection method are provided. The electrostatic protection circuit includes a first switch transistor, a second switch transistor, a third switch transistor, a fourth switch transistor, and a fifth switch transistor. A gate electrode and a first electrode of the first switch transistor are connected with a first signal line respectively, and a second electrode of the first switch transistor is connected with a second signal line; a gate electrode and a first electrode of the second switch transistor are connected with the first signal line respectively, and a second electrode of the second switch transistor is connected with a gate electrode of the fourth switch transistor; a gate electrode and a first electrode of the third switch transistor are connected with a third signal line respectively, and a second electrode of the third switch transistor is connected with the gate electrode of the fourth switch transistor; a first electrode of the fourth switch transistor is connected with the third signal line, a second electrode of the fourth switch transistor is connected with a second electrode of the fifth switch transistor and the gate electrode of the second switch transistor; a gate electrode and a first electrode of the fifth switch transistor being connected with the second signal line respectively, thereby effectively releasing static electricity.

13 Claims, 7 Drawing Sheets

(51) Int. Cl.
*H01L 27/02* (2006.01)
*G02F 1/1362* (2006.01)

(56) References Cited

U.S. PATENT DOCUMENTS

| | | | | | |
|---|---|---|---|---|---|
| 6,791,632 | B2* | 9/2004 | Lee | .................. | G02F 1/136204 349/40 |
| 8,416,166 | B2* | 4/2013 | Shin | ..................... | G09G 3/3648 345/204 |
| 9,048,320 | B2* | 6/2015 | Yamazaki | ........... | H01L 27/0266 |
| 9,130,067 | B2* | 9/2015 | Yamazaki | ........... | H01L 27/0248 |
| 2005/0285984 | A1* | 12/2005 | Tsai | .................... | G02F 1/13624 349/40 |
| 2006/0077162 | A1* | 4/2006 | Chou | ................ | G02F 1/136204 345/92 |
| 2006/0119757 | A1* | 6/2006 | Tsao | ................. | G02F 1/136204 349/40 |
| 2006/0279667 | A1* | 12/2006 | Tsai | .................... | G02F 1/13454 349/40 |
| 2007/0268420 | A1* | 11/2007 | Tsai | .................... | G02F 1/13452 349/40 |
| 2008/0266475 | A1* | 10/2008 | Chang | ............... | G02F 1/136204 349/40 |
| 2012/0147286 | A1* | 6/2012 | Oda | ....................... | G06F 3/0421 349/43 |
| 2014/0092510 | A1* | 4/2014 | Huang | .................. | H02H 9/045 361/56 |
| 2014/0126093 | A1* | 5/2014 | Duan | ................ | G02F 1/136204 361/56 |

OTHER PUBLICATIONS

Written Opinion of the International Searching Authority dated Nov. 22, 2013; PCT/CN2013/074638.
First Chinese Office Action Appln. No. 201310057443.X; Dated Sep. 29, 2014.

* cited by examiner

ELECTROSTATIC PROTECTION CIRCUIT, DISPLAY DEVICE AND ELECTROSTATIC PROTECTION METHOD

TECHNICAL FIELD

Embodiments of the present invention relate to an electrostatic protection circuit, a display device and an electrostatic protection method.

BACKGROUND

Liquid crystal displays are most common panel displays at present, and thin film transistor liquid crystal displays (TFT-LCDs) are main stream products for liquid crystal displays.

In the manufacturing industry of TFT-LCDs, electrostatic problem has direct influence on the yield of produced liquid crystal display panels. Since static electricity occurs due to various reasons, in the manufacturing process of TFT-LCDs many technical processes may cause high voltage static charges. For example, during performing of a rubbing process, friction between a rubbing cloth and a display panel of a TFT-LCD can generate high static voltages. Since high voltage static charges are prone to give rise to breakdown of thin film transistors that control the driving of pixels, resulting in failure of pixel driving and low quality of liquid crystal display panels, high voltage static electricity should be released or compromised in time and effectively in the manufacturing process of TFT-LCDs, that is, electrostatic protection circuits should be designed to protect display panels.

Conventional electrostatic protection circuits are generally designed between a gate line/data line and a common line/short ring, in a simple circuit design, through which generated static electricity can not be released effectively, thereby failing to protect operating devices in a display area.

SUMMARY

Embodiments of the present invention provide an electrostatic protection circuit, a display device and an electrostatic protection method for effectively releasing electrostatic charges, hence protecting working devices in the display area.

One embodiment of the present invention provides an electrostatic protection circuit comprising a first switch transistor, a second switch transistor, a third switch transistor, a fourth switch transistor, and a fifth switch transistor;

a gate electrode and a first electrode of the first switch transistor are connected with a first signal line respectively, and a second electrode of the first switch transistor is connected with a second signal line;

a gate electrode and a first electrode of the second switch transistor are connected with the first signal line respectively, and a second electrode of the second switch transistor is connected with a gate electrode of the fourth switch transistor;

a gate electrode and a first electrode of the third switch transistor are connected with a third signal line respectively, and a second electrode of the third switch transistor is connected with the gate electrode of the fourth switch transistor;

a first electrode of the fourth switch transistor is connected with the third signal line, and a second electrode of the fourth switch transistor is connected with a second electrode of the fifth switch transistor and the gate electrode of the second switch transistor respectively; and a gate electrode and a first electrode of the fifth switch transistor are connected with the second signal line respectively, and the second electrode of the fifth switch transistor is connected with the gate electrode of the second switch transistor.

Furthermore, for example, both the first signal line and the second signal line are scanning lines, or both the first signal line and the second signal line are data lines.

Furthermore, for example, the third signal line may be one of a common line and a short ring.

Furthermore, for example, where a static voltage formed on the first signal line reaches a turn-on voltage, the first switch transistor can be turned on to conduct electrostatic charges on the first signal line to the second signal line, and the second switch transistor and the fourth switch transistor can be turned on to conduct the electrostatic charges on the first signal line to the third signal line; where a static voltage formed on the second signal line reaches the turn-on voltage, the fifth switch transistor can be turned on to conduct electrostatic charges on the second signal line to the first signal line, the second switch transistor and the fourth switch transistor can be turned on to conduct the electrostatic charges on the second signal line to the third signal line; and where a static voltage formed on the third signal line reaches the turn-on voltage, the third switch transistor and the fourth switch transistor can be turned on to conduct electrostatic charges on the third signal line to the first signal line, the second switch transistor can be turned on to conduct the electrostatic charges on the third signal line to the first signal line.

Furthermore, in case the first switch transistor fails, where a static voltage formed on the first signal line reaches a turn-on voltage, the second switch transistor and the fourth switch transistor may be turned on to conduct electrostatic charges on the first signal line to the third signal line; where a static voltage formed on the second signal line reaches the turn-on voltage, the fifth switch transistor may be turned on to conduct electrostatic charges on the second signal line to the first signal line, and the second switch transistor and the fourth switch transistor are turned on to conduct the electrostatic charges on the second signal line to the third signal line; and where a static voltage formed on the third signal line reaches the turn-on voltage, the third switch transistor and the fourth switch transistor can be turned on to conduct the electrostatic charges on the third signal line to the first signal line.

Furthermore, in case the second switch transistor fails, where a static voltage formed on the first signal line reaches a turn-on voltage, the first switch transistor is turned on to conduct electrostatic charges on the first signal line to the second signal line; where a static voltage formed on the second signal line reaches the turn-on voltage, the fifth switch transistor is turned on to conduct electrostatic charges on the second signal line to the first signal line; and where a static voltage formed on the third signal line reaches the turn-on voltage, the third switch transistor and the fourth switch transistor are turned on to conduct electrostatic charges on the third signal line to the first signal line, and the first switch transistor is turned on to conduct the electrostatic charges on the third signal line to the second signal line.

Furthermore, in case the third switch transistor fails, where a static voltage formed on the first signal line reaches a turn-on voltage, the first switch transistor is turned on to conduct electrostatic charges on the first signal line to the second signal line, and the second switch transistor and the fourth switch transistor are turned on to conduct the electrostatic charges on the first signal line to the third signal line; and where a static voltage formed on the second signal line reaches the turn-on voltage, the fifth switch transistor is turned on to conduct electrostatic charges on the second signal line to the first signal line, and the second switch transistor and the fourth switch transistor are turned on to conduct the electrostatic charges on the second signal line to the third signal line.

Furthermore, in case the fourth switch transistor fails, where a static voltage formed on the first signal line reaches a turn-on voltage, the first switch transistor is turned on to conduct electrostatic charges on the first signal line to the second signal line; and where a static voltage formed on the second signal line reaches the turn-on voltage, the fifth switch transistor is turned on to conduct electrostatic charges on the second signal line to the first signal line.

Furthermore, in case the fifth switch transistor fails, where a static voltage formed on the first signal line reaches a turn-on voltage, the first switch transistor is turned on to conduct electrostatic charges on the first signal line to the second signal line, and the second switch transistor and the fourth switch transistor are turned on to conduct the electrostatic charges on the first signal line to the third signal line; and where a static voltage formed on the third signal line reaches the turn-on voltage, the third switch transistor and the fourth switch transistor are turned on to conduct the electrostatic charges on the third signal line to the first signal line.

An embodiment of the present invention further provides a display device comprising the above-mentioned electrostatic protection circuit.

An embodiment of the present invention further provides an electrostatic protection method for implementing electrostatic protection for a first signal line, a second signal line and a third signal line, and the electrostatic protection method comprises:

connecting a gate electrode and a first electrode of a first switch transistor with the first signal line respectively, and connecting a second electrode of the first switch transistor with the second signal line;

connecting a gate electrode and a first electrode of a second switch transistor with the first signal line respectively, and connecting a second electrode of the second switch transistor with a gate electrode of a fourth switch transistor;

connecting a gate electrode and a first electrode of a third switch transistor with the third signal line respectively, and connecting a second electrode of the third switch transistor with the gate electrode of the fourth switch transistor;

connecting a first electrode of the fourth switch transistor with the third signal line, and connecting a second electrode of the fourth switch transistor with a second electrode of a fifth switch transistor and the gate electrode of the second switch transistor respectively; and connecting a gate electrode and a first electrode of the fifth switch transistor with the second signal line, and connecting the second electrode of the fifth switch transistor with the gate electrode of the second switch transistor.

Furthermore, the electrostatic protection method disposes the first signal line and the second signal line adjacently to each other; and both the first signal line and the second signal line are scanning lines or both of them are data lines.

Furthermore, the third signal line is a common line or a short ring.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the electrostatic protection circuit, the display device and the electrostatic protection method provided in the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Figure 1:
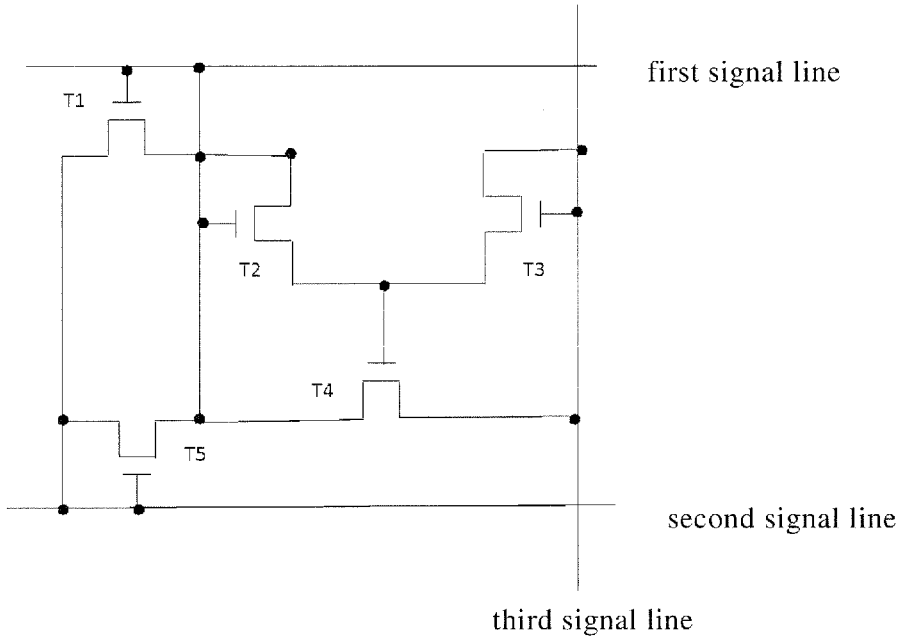
FIG. 1 is a structural diagram of an electrostatic protection circuit provided in a first embodiment of the present invention.

FIG. 1 is a structural diagram of an electrostatic protection circuit provided in a first embodiment of the present invention. As illustrated in FIG. 1, the electrostatic protection circuit includes: a first switch transistor T1, a second switch transistor T2, a third switch transistor T3, a fourth switch transistor T4 and a fifth switch transistor T5; a gate electrode and a first electrode of the first switch transistor T1 are connected with a first signal line respectively, and a second electrode of the first switch transistor T1 is connected with the second signal line; a gate electrode and a first electrode of the second switch transistor T2 are connected with the first signal line respectively, and a second electrode of the second switch transistor T2 is connected with a gate electrode of the fourth switch transistor T4; a gate electrode and a first electrode of the third switch transistor T3 are connected with a third signal line respectively, and a second electrode of the third switch transistor T3 is connected with the gate electrode of the fourth switch transistor T4; the gate electrode of the fourth switch transistor T4 is connected with the second electrode of the second switch transistor T2 and the second electrode of the third switch transistor T3 respectively, a first electrode of the fourth switch transistor T4 is connected with the third signal line, and a second electrode of the fourth switch transistor T4 is connected with a second electrode of the fifth switch transistor T5 and the gate electrode of the second switch transistor T2 respectively; a gate electrode and a first electrode of the fifth switch transistor T5 are connected with the second signal line respectively, and the second electrode of the fifth switch transistor T5 is connected with the second electrode of the fourth switch transistor T4 and the gate electrode of the second switch transistor T2 respectively.

In the present embodiment of the present application, the electrostatic protection circuit is configured for electrostatic protection among the first, second and third signal lines, therefore the first, second and third signal lines are not included in the electrostatic protection circuit.

The first, second and third signal line may be any conductive wirings on an array substrate such as a gate line, a data line, a common line, and a short ring that functions as common line.

The electrostatic protection circuit may be provided between adjacent signal lines or between nonadjacent lines. An example in which the first signal line and the second signal line are disposed adjacently to each other is explained in this embodiment.

In the embodiments of the present application, description is given with an example in which both the first signal line and the second signal line are scanning lines or data lines, and with an example in which the third signal line is a common electrode or a short ring. They are only illustrative implementations rather than any limitation to the protection scope of the present invention. The first signal line and the second signal line are any two data lines or any two scanning lines disposed adjacently to each other and the third signal line is a common electrode or a short ring. When the first signal line and the second signal line are any two scanning lines disposed adjacently, since a scanning line can be scanned periodically, each scanning line can serve as the first scanning line or the second scanning line at the same time, hence more effectively releasing static electricity on the scanning line wherein the scanning line is a gate line.

In addition, in this embodiment, the first switch transistor T1, the second switch transistor 12, the third switch transistor T3, the fourth switch transistor T4, and the fifth switch transistor T5 may be for example thin film transistors, and may also be other types of switch transistors with gating switch function. When the gate electrode of a thin film transistor is turned on, the first electrode and second electrode of the thin film transistor are conducted with each other. When the static voltage on the first electrode of the thin film transistor is high, an electrostatic discharge current flows from the first electrode to the second electrode; and when the static voltage on the second electrode of the thin film transistor is high, an electrostatic discharge current flows from the second electrode to the first electrode. Application of the switch transistor with the above-mentioned operating principle (such as a thin film transistor) in the electrostatic protection circuit of the present embodiment allows more flexible and effective release of static electricity without limitation imposed by the flow direction of current.

Figure 2:
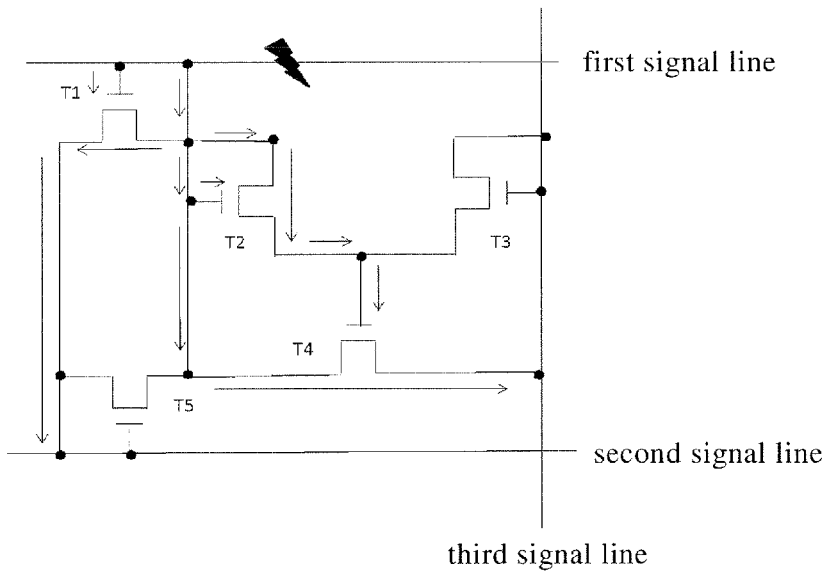
FIG. 2 is a schematic diagram showing an operation state of the electrostatic protection circuit illustrated in FIG. 1.

FIG. 2 is a schematic diagram showing an operation state of the electrostatic protection circuit illustrated in FIG. 1. As illustrated in FIG. 2, electrostatic charges accumulate on the first signal line to form a static voltage, and when the static voltage rises up to the turn-on voltage, the first switch transistor T1 is turned on to conduct the electrostatic charges on the first signal line to the second signal line, and the second switch transistor T2 and the fourth switch transistor T4 are turned on to conduct the electrostatic charges on the first signal line to the third signal line.

Figure 3:
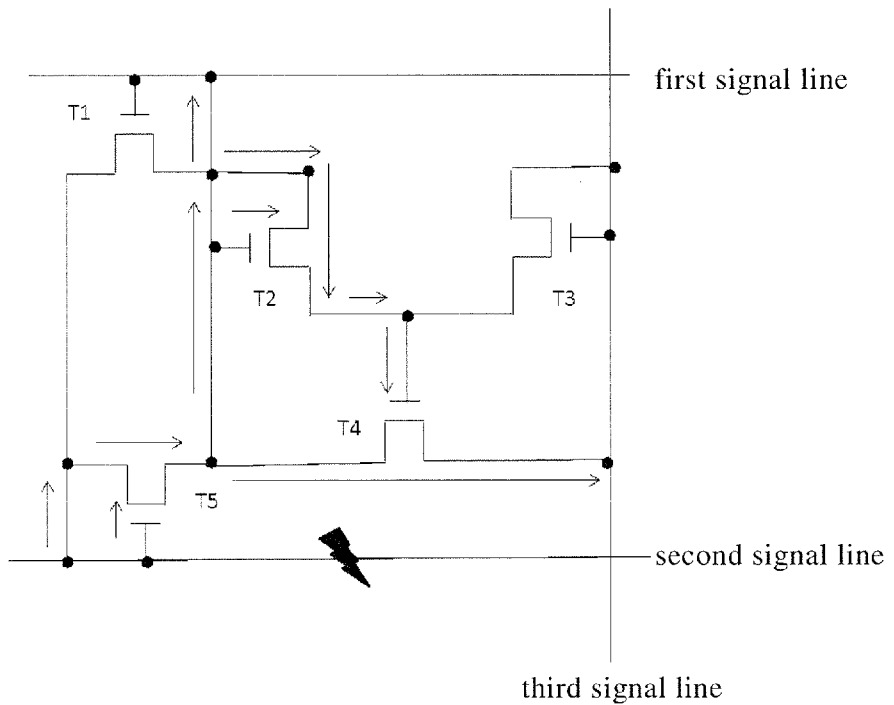
FIG. 3 is a schematic diagram showing another operation state of the electrostatic protection circuit illustrated in FIG. 1.

FIG. 3 is a schematic diagram showing another operation state of the electrostatic protection circuit illustrated in FIG. 1. As illustrated in FIG. 3, electrostatic charges accumulate on the second signal line to form a static voltage, and when the static voltage rises up to the turn-on voltage, the fifth switch transistor T5 is turned on to conduct the electrostatic charges on the second signal line to the first signal line, and the second switch transistor T2 and the fourth switch transistor T4 are turned on to conduct the electrostatic charges on the second signal line to the third signal line.

Figure 4:
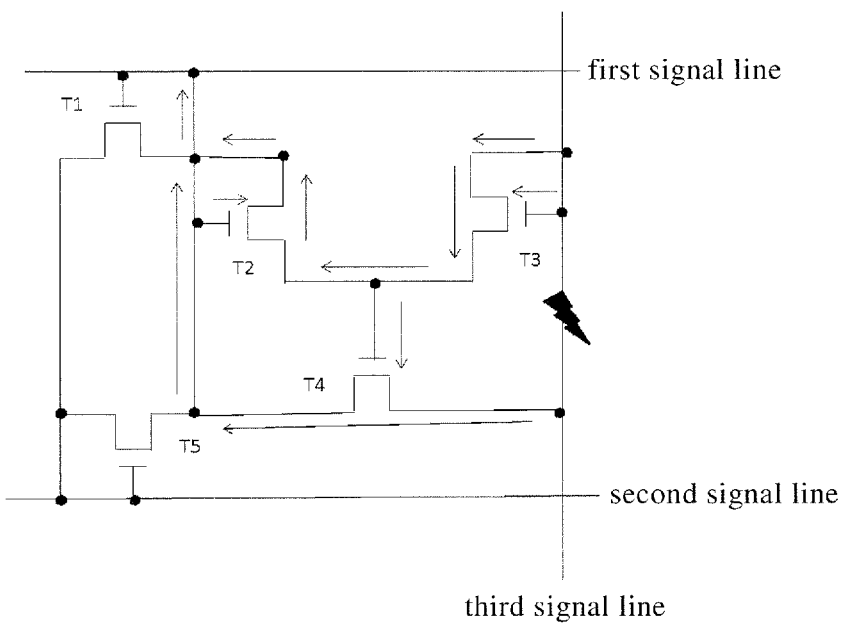
FIG. 4 is a schematic diagram showing yet another operation state of the electrostatic protection circuit illustrated in FIG. 1.

FIG. 4 is a schematic diagram showing yet another operation state of the electrostatic protection circuit illustrated in FIG. 1. As illustrated in FIG. 4, electrostatic charges accumulate on the third signal line to form a static voltage, and when the static voltage rises up to the turn-on voltage, the third switch transistor T3 and the fourth switch transistor T4 are turned on to conduct the electrostatic charges on the third signal line to the first signal line, and the second switch transistor T2 is turned on to conduct the electrostatic charges on the third signal line to the first signal line. Therefore, electrostatic charges accumulated on the third signal line are released to the first signal line. If at this moment the voltage on the first signal line is still high, electrostatic charges on the first signal line may also be conducted to the second signal line via the first switch transistor T1.

In the electrostatic protection circuit provided in the present embodiment in which the first switch transistor T1, the second switch transistor T2, the third switch transistor T3, the fourth switch transistor T4 and the fifth switch transistor T5 are connected among the first signal line, the second signal line and the third signal line in the above mentioned circuit structure, when the static voltage accumulated on any signal line reaches a turn-on voltage, electrostatic charges on this signal line can be released to the other two signal lines via the electrostatic protection circuit, thereby allowing electrostatic charges to release in various directions and more effectively protecting operating devices in the display area.

The electrostatic protection circuit illustrated in the present embodiment can work normally even if any switch transistor fails. Generally, in practice, there is a very small probability to occur short circuit fault. The illustrative embodiments in the following contents are for the case of open circuit fault of a switch transistor.

Figure 5:
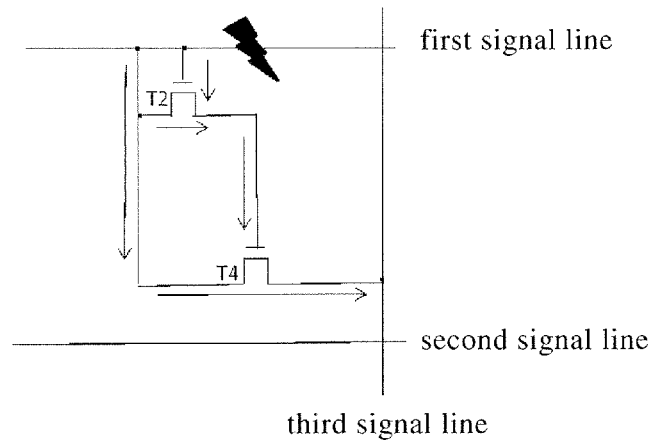
FIG. 5 is an equivalent circuit diagram upon failure of a first switch transistor illustrated in FIG. 1.

FIG. 5 is an equivalent circuit diagram upon failure of the first switch transistor T1 illustrated in FIG. 1. As illustrated in FIG. 5, electrostatic charges accumulate on the first signal line to form a static voltage, and when the static voltage formed on the first signal line reaches the turn-on voltage, the second switch transistor T2 and the fourth switch transistor T4 are turned on to conduct the electrostatic charges on the first signal line to the third signal line. More specifically, the second switch transistor T2 and the fourth switch transistor T4 are turned on in turn to conduct the electrostatic charges on the first signal line to the third signal line.

Figure 6:
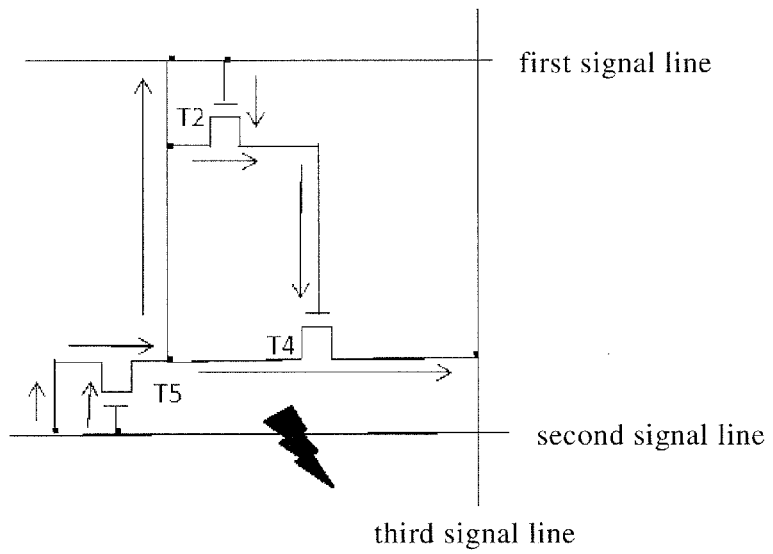
FIG. 6 is another equivalent circuit diagram upon failure of a first switch transistor illustrated in FIG. 1.

FIG. 6 is another equivalent circuit diagram upon failure of the first switch transistor T1 illustrated in FIG. 1. As illustrated in FIG. 6, electrostatic charges accumulate on the second signal line to form a static voltage, and when the static voltage rises up to the turn-on voltage, the fifth switch transistor T5 is turned on to conduct the electrostatic charges on the second signal line to the first signal line, and the second switch transistor T2 and the fourth switch transistor T4 are turned on to conduct the electrostatic charges on the second signal line to the third signal line. More specifically, the fifth switch transistor T5 is turned on to conduct the electrostatic charges on the second signal line to the first signal line, and then the second switch transistor T2 and the fourth switch transistor T4 are turned on in turn to conduct the electrostatic charges on the second signal line to the third signal line.

Figure 7:
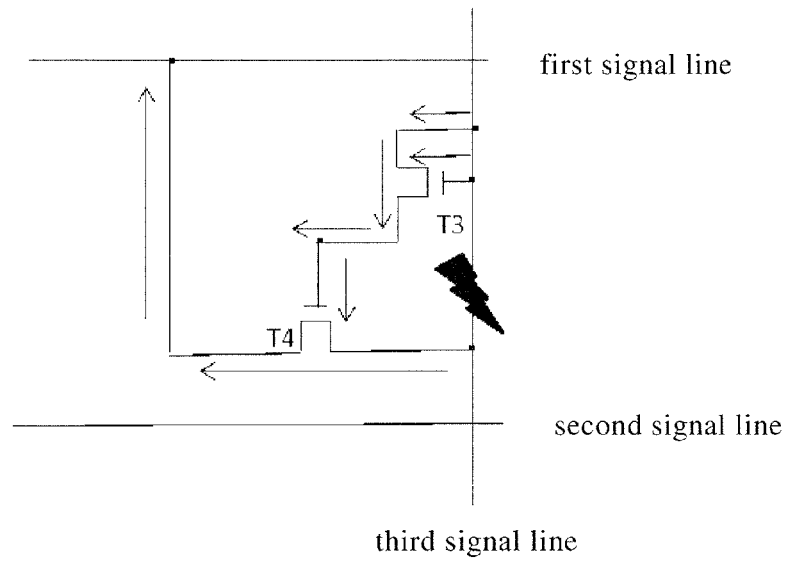
FIG. 7 is yet another equivalent circuit diagram upon failure of a first switch transistor illustrated in FIG. 1.

FIG. 7 is yet another equivalent circuit diagram upon failure of the first switch transistor T1 illustrated in FIG. 1. As illustrated in FIG. 7, electrostatic charges accumulate on the third signal line to form a static voltage, and when the static voltage formed on the third signal line reaches a turn-on voltage, the third switch transistor T3 and the fourth switch transistor T4 are turned on to conduct the electrostatic charges on the third signal line to the first signal line. More specifically, the third switch transistor T3 and the fourth switch transistor T4 are turned on in turn to conduct the electrostatic charges on the third signal line to the first signal line.

Figure 8:
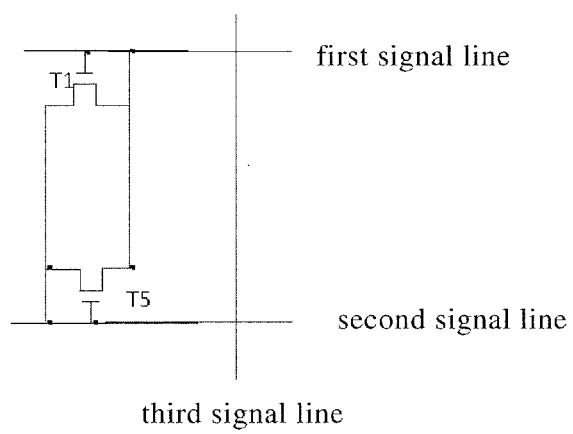
FIG. 8 is an equivalent circuit diagram upon failure of a second switch transistor illustrated in FIG. 1.

FIG. 8 is an equivalent circuit diagram upon failure of the second switch transistor T2 illustrated in FIG. 1. As illustrated in FIG. 8, if electrostatic charges accumulate on the first signal line to form a static voltage, and when the static voltage formed on the first signal line reaches the turn-on voltage, the first switch transistor T1 is turned on to conduct the electrostatic charges on the first signal line to the second signal line.

If electrostatic charges accumulate on the second signal line to form a static voltage, and when the static voltage formed on the second signal line reaches the turn-on voltage, the fifth switch transistor T5 is turned on to conduct the electrostatic charges on the second signal line to the first signal line.

Figure 9:
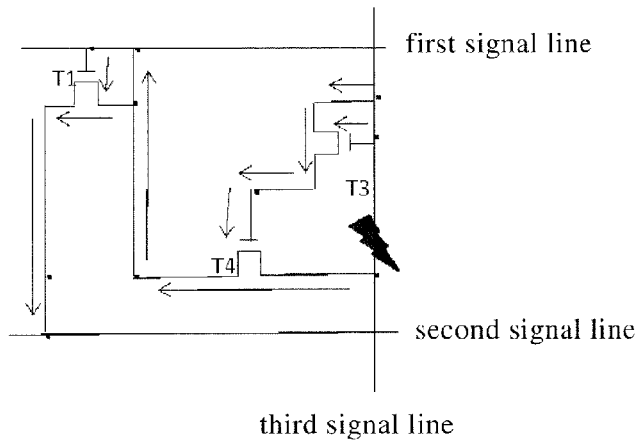
FIG. 9 is another equivalent circuit diagram upon failure of a second switch transistor illustrated in FIG. 1.

FIG. 9 is another equivalent circuit diagram upon failure of the second switch transistor T2 illustrated in FIG. 1. As illustrated in FIG. 9, electrostatic charges accumulate on the third signal line to form a static voltage, and when the static voltage on the third signal line reaches the turn-on voltage, the third switch transistor T3 and the fourth switch transistor T4 are turned on to conduct the electrostatic charges on the third signal line to the first signal line, and the first switch transistor T1 is turned on to conduct the electrostatic charges on the third signal line to the second signal line. More specifically, the third switch transistor T3 and the fourth switch transistor T4 are turned on in turn to conduct the electrostatic charges on the third signal line to the first signal line, and then the first switch transistor T1 is turned on to conduct the electrostatic charges on the third signal line to the second signal line.

Figure 10:
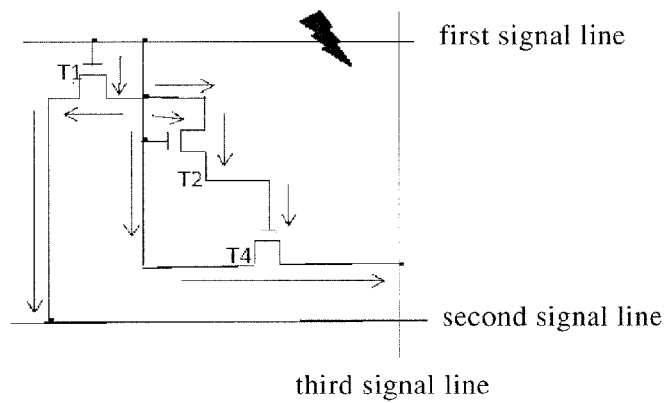
FIG. 10 is an equivalent circuit diagram upon failure of a third switch transistor illustrated in FIG. 1.

FIG. 10 is an equivalent circuit diagram upon failure of the third switch transistor T3 illustrated in FIG. 1. As illustrated in FIG. 10, electrostatic charges accumulate on the first signal line to form a static voltage, and when the static voltage rises up to the turn-on voltage, the first switch transistor T1 is turned on to conduct the electrostatic charges on the first signal line to the second signal line, and the second switch transistor T2 and the fourth switch transistor T4 are turned on to conduct the electrostatic charges on the first signal line to the third signal line. More specifically, the first switch transistor T1 is turned on to conduct the electrostatic charges on the first signal line to the second signal line, and at the same time the second switch transistor T2 and the fourth switch transistor T4 are turned on in turn to conduct the electrostatic charges on the first signal line to the third signal line.

Figure 11:
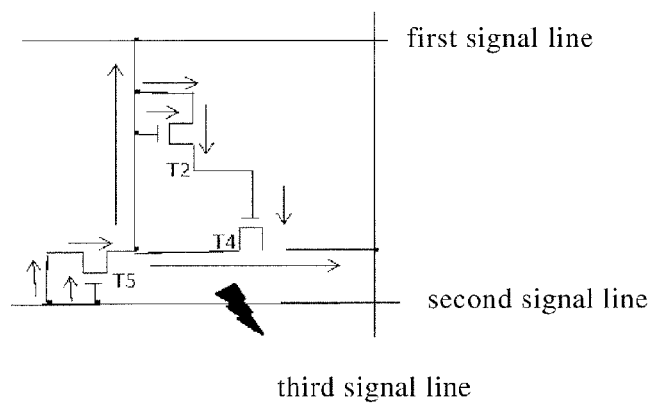
FIG. 11 is another equivalent circuit diagram upon failure of a third switch transistor illustrated in FIG. 1.

FIG. 11 is another equivalent circuit diagram upon failure of the third switch transistor T3 illustrated in FIG. 1. As illustrated in FIG. 11, electrostatic charges accumulate on the second signal line to form a static voltage, and when the static voltage rises up to the turn-on voltage, the fifth switch transistor T5 is turned on to conduct the electrostatic charges on the second signal line to the first signal line, and the second switch transistor T2 and the fourth switch transistor T4 are turned on to conduct the electrostatic charges on the second signal line to the third signal line. More specifically, the fifth switch transistor T5 is turned on to conduct the electrostatic charges on the second signal line to the first signal line, and then electrostatic charges conducted to the first signal line turn on the second switch transistor T2 and the fourth switch transistor T4 to conduct the electrostatic charges on the second signal line to the third signal line.

Figure 12:
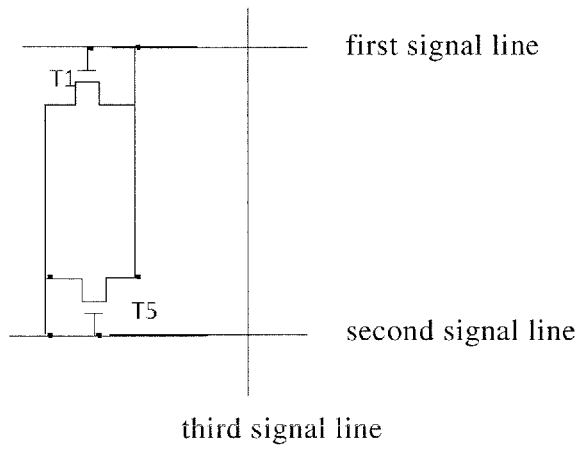
FIG. 12 is an equivalent circuit diagram upon failure of a fourth switch transistor illustrated in FIG. 1.

FIG. 12 is an equivalent circuit diagram upon failure of the fourth switch transistor T4 illustrated in FIG. 1. As illustrated in FIG. 12, if electrostatic charges accumulate on the first signal line to form a static voltage, and when the static voltage formed on the first signal line reaches the turn-on voltage, the first switch transistor T1 is turned on to conduct the electrostatic charges on the first signal line to the second signal line.

If electrostatic charges accumulate on the second signal line to form a static voltage, and when the static voltage formed on the second signal line reaches the turn-on voltage, the fifth switch transistor T5 is turned on to conduct the electrostatic charges on the second signal line to the first signal line.

Figure 13:
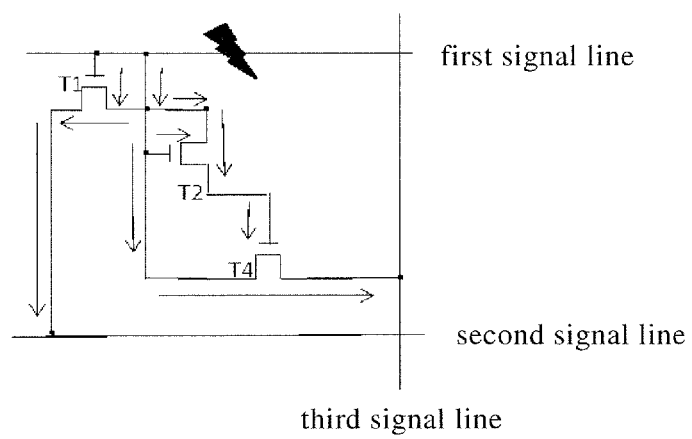
FIG. 13 is an equivalent circuit diagram upon failure of a fifth switch transistor illustrated in FIG. 1.

FIG. 13 is an equivalent circuit diagram upon failure of the fifth switch transistor T5 illustrated in FIG. 1. As illustrated in FIG. 13, electrostatic charges accumulate on the first signal line to form a static voltage, and when the static voltage rises up to the turn-on voltage, the first switch transistor T1 is turned on to conduct the electrostatic charges on the first signal line to the second signal line, and the second switch transistor T2 and the fourth switch transistor T4 are turned on to conduct the electrostatic charges on the first signal line to the third signal line. More specifically, the first switch transistor T1 is turned on to conduct the electrostatic charges on the first signal line to the second signal line, and at the same time the second switch transistor T2 and the fourth switch transistor T4 are turned on to conduct the electrostatic charges on the first signal line to the third signal line.

Figure 14:
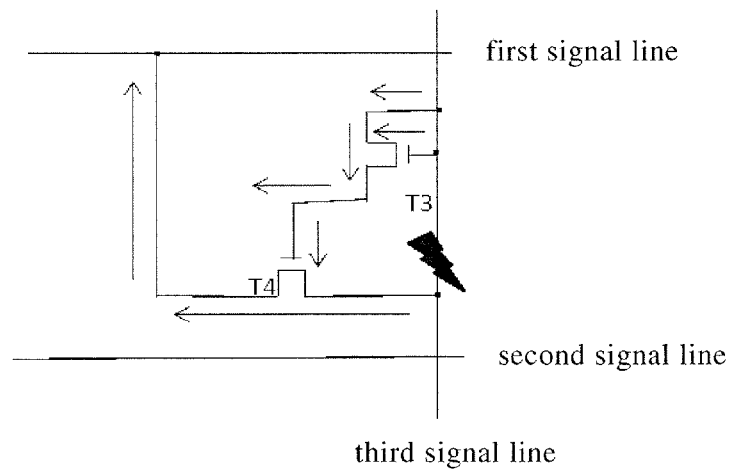
FIG. 14 is another equivalent circuit diagram upon failure of a fifth switch transistor illustrated in FIG. 1.

FIG. 14 is another equivalent circuit diagram upon failure of the fifth switch transistor T5 illustrated in FIG. 1. As illustrated in FIG. 14, electrostatic charges accumulate on the third signal line to form a static voltage, and when the static voltage formed on the third signal line reaches a turn-on voltage, the third switch transistor T3 and the fourth switch transistor T4 are turned on to conduct the electrostatic charges on the third signal line to the first signal line. More specifically, the third switch transistor T3 and the fourth switch transistor T4 are turned on in turn to conduct the electrostatic charges on the third signal line to the first signal line.

In the technical solution of the electrostatic protection circuit provided in the present embodiment, when any one switch transistor fails in the electrostatic protection circuit, the remaining switch transistor circuit parts thereof still can normally release electrostatic charges on the above-mentioned signal lines, hence avoiding damage to the display panel due to static electricity.

In the electrostatic protection circuit provided in the present embodiment in which the first switch transistor, the second switch transistor, the third switch transistor, the fourth switch transistor and the fifth switch transistor are connected among the first signal line, the second signal line and the third signal line in a certain circuit structure, when the static voltage accumulated on any signal line reaches a turn-on voltage, electrostatic charges on this signal line can be released to the other one or two signal lines via the electrostatic protection circuit, thereby allowing electrostatic charges to release in various directions and more effectively protecting operating devices in the display area. At the same time, when any one switch transistor in the electrostatic protection circuit fails, the remaining switch transistor circuit parts thereof still can normally release electrostatic charges on the above-mentioned signal lines, thereby avoiding damage to the display panel due to static electricity.

A second embodiment of the present invention provides a display device comprising the electrostatic protection circuit provided in the above-mentioned first embodiment.

The display device is an LCD display device or an LED display device. Where the display device is an LCD display device, the electrostatic protection circuit is arranged on an array substrate of the LCD.

The electrostatic protection circuit is provided between any two data lines (or scanning lines) and common lines (or short rings) disposed adjacently on the display device.

In the display device provided in the present embodiment, an electrostatic protection circuit is connected between any two adjacent scanning lines (or data lines) and common lines (or short rings) on the display device, and when a static voltage accumulated on any one scanning line reaches a turn-on voltage, electrostatic charges on the line can be released to the other two lines via the electrostatic protection circuit, thereby allowing electrostatic discharge to be released in various directions and more effectively protecting pixel areas. At the same time, where any one switch transistor fails in the electrostatic protection circuit, the remaining switch transistor circuit parts thereof can still normally release electrostatic charges on the above-mentioned signal lines. In addition, since scanning lines are periodically scanned, each scanning line can serve as a first scanning line or a second scanning line at the same time, thereby more effectively implementing electrostatic discharge on scanning lines, hence avoiding damage to the display panel due to static electricity.

A third embodiment of the present invention provides an electrostatic protection method for electrostatic protection of a first signal line, a second signal line and a third signal line, the method comprising the following:

connecting a gate electrode and a first electrode of a first switch transistor with the first signal line respectively, and connecting a second electrode of the first switch transistor with the second signal line;

connecting a gate electrode and a first electrode of a second switch transistor with the first signal line respectively, and connecting a second electrode of the second switch transistor with a gate electrode of a fourth switch transistor;

connecting a gate electrode and a first electrode of a third switch transistor with the third signal line respectively, and connecting a second electrode of the third switch transistor with the gate electrode of the fourth switch transistor;

connecting the gate electrode of the fourth switch transistor with the second electrode of the second switch transistor and the second electrode of the third switch transistor respectively, connecting a first electrode of the fourth switch transistor with the third signal line, and connecting a second electrode of the fourth switch transistor with a second electrode of a fifth switch transistor and the gate electrode of the second switch transistor respectively;

connecting a gate electrode and a first electrode of the fifth switch transistor with the second signal line, and connecting the second electrode of the fifth switch transistor with the second electrode of the fourth switch transistor and the gate electrode of the second switch transistor respectively.

Optionally, the first signal line and the second signal line are disposed adjacently to each other; both the first signal line and the second signal line are scanning lines, or both of them are data lines; the third signal line is a common line or a short ring.

This electrostatic protection method can release static electricity in various directions, and even if a certain switch transistor fails in the above-mentioned electrostatic protection circuit, the method can smoothly release static electricity accumulation.

The above-mentioned electrostatic protection method may implement electrostatic protection with a circuit provided in any one of the above-mentioned embodiments of the electrostatic protection circuit, which can also address technical problems to be solved in the present invention.

With the electrostatic protection method provided in the present embodiment, by connecting an electrostatic protection circuit between any two adjacent scanning lines (or data lines) and common lines (or short rings) on the display device, where a static voltage accumulated on any one scanning line reaches a turn-on voltage, electrostatic charges on the line can be released to the other one or two lines via the electrostatic protection circuit, thereby allowing electrostatic discharge to be released in various directions and more effectively protecting pixel areas. At the same time, where any one switch transistor fails in the electrostatic protection circuit, the remaining switch transistor circuit parts thereof still can normally release electrostatic charges on the above-mentioned signal lines. In addition, since scanning lines are periodically scanned, each scanning line may serve as a first scanning line or a second scanning line at the same time, thereby more effectively implementing electrostatic discharge on scanning lines, hence avoiding damage to the display panel due to static electricity.

It is understand that the above implementations are only illustrative embodiments used for explaining the principle of the present invention, but the present invention is not limited thereto. For those skilled in the art, various modifications and improvements may be made without departing from the spirit and scope of the present invention, which should all be regarded as falling within the protection scope of the present invention.

The invention claimed is:

1. An electrostatic protection circuit comprising a first switch transistor, a second switch transistor, a third switch transistor, a fourth switch transistor, and a fifth switch transistor;

a gate electrode and a first electrode of the first switch transistor being connected with a first signal line respectively, and a second electrode of the first switch transistor being connected with a second signal line;

a gate electrode and a first electrode of the second switch transistor being connected with the first signal line respectively, and a second electrode of the second switch transistor being connected with a gate electrode of the fourth switch transistor;

a gate electrode and a first electrode of the third switch transistor being connected with a third signal line respectively, and a second electrode of the third switch transistor being connected with the gate electrode of the fourth switch transistor;

a first electrode of the fourth switch transistor being connected with the third signal line, and a second electrode of the fourth switch transistor being connected with a second electrode of the fifth switch transistor and the gate electrode of the second switch transistor respectively; and a gate electrode and a first electrode of the fifth switch transistor being connected with the second signal line respectively, and the second electrode of the fifth switch transistor being connected with the gate electrode of the second switch transistor;

wherein the first signal line and the second signal line are disposed adjacently to each other, and the first signal line and the second signal line are both scanning lines; or the first signal line and the second signal line are disposed adjacently to each other, and the first signal line and the second signal line are both data lines;

and wherein the third signal line is one of a common line and a short ring.

2. The electrostatic protection circuit of claim 1, wherein
where a static voltage formed on the first signal line reaches a turn-on voltage, the first switch transistor s turned on to conduct electrostatic charges on the first signal line to the second signal line, and the second switch transistor and the fourth switch transistor are turned on to conduct the electrostatic charges on the first signal line to the third signal line;

where a static voltage formed on the second signal line reaches the turn-on voltage, the fifth switch transistor is turned on to conduct electrostatic charges on the second signal line to the first signal line, and the second switch transistor and the fourth switch transistor are turned on to conduct the electrostatic charges on the second signal line to the third signal line; and where a static voltage formed on the third signal line reaches the turn-on voltage, the third switch transistor and the fourth switch transistor are turned on to conduct electrostatic charges on the third signal line to the first signal line, and the second switch transistor is turned on to conduct the electrostatic charges on the third signal line to the first signal line.

3. The electrostatic protection circuit of claim 1, wherein in case the first switch transistor fails,
where a static voltage formed on the first signal line reaches a turn-on voltage, the second switch transistor and the fourth switch transistor are turned on to conduct electrostatic charges on the first signal line to the third signal line;

where a static voltage formed on the second signal line reaches the turn-on voltage, the fifth switch transistor is turned on to conduct electrostatic charges on the second signal line to the first signal line, and the second switch transistor and the fourth switch transistor are turned on to conduct the electrostatic charges on the second signal line to the third signal line; and where a static voltage formed on the third signal line reaches the turn-on voltage, the third switch transistor and the fourth switch transistor are turned on to conduct electrostatic charges on the third signal line to the first signal line.

4. The electrostatic protection circuit of claim 1, wherein in case the second switch transistor fails,
where a static voltage formed on the first signal line reaches a turn-on voltage, the first switch transistor is turned on to conduct electrostatic charges on the first signal line to the second signal line;

where a static voltage formed on the second signal line reaches the turn-on voltage, the fifth switch transistor is turned on to conduct electrostatic charges on the second signal line to the first signal line; and where a static voltage formed on the third signal line reaches the turn-on voltage, the third switch transistor and the fourth switch transistor are turned on to conduct electrostatic charges on the third signal line to the first signal line, and the first switch transistor is turned on to conduct the electrostatic charges on the third signal line to the second signal line.

5. The electrostatic protection circuit of claim 1, wherein in case the third switch transistor fails,
where a static voltage formed on the first signal line reaches a turn-on voltage, the first switch transistor is turned on to conduct electrostatic charges on the first signal line to the second signal line, and the second switch transistor and the fourth switch transistor are turned on to conduct the electrostatic charges on the first signal line to the third signal line; and where a static voltage formed on the second signal line reaches the turn-on voltage, the fifth switch transistor is turned on to conduct electrostatic charges on the second signal line to the first signal line, and the second switch transistor and the fourth switch transistor are turned on to conduct the electrostatic charges on the second signal line to the third signal line.

6. The electrostatic protection circuit of claim 1, wherein in case the fourth switch transistor fails,
where a static voltage formed on the first signal line reaches a turn-on voltage, the first switch transistor is turned on to conduct electrostatic charges on the first signal line to the second signal line; and where a static voltage formed on the second signal line reaches the turn-on voltage, the fifth switch transistor is turned on to conduct electrostatic charges on the second signal line to the first signal line.

7. The electrostatic protection circuit of claim 1, wherein in case the fifth switch transistor fails,
where a static voltage formed on the first signal line reaches a turn-on voltage, the first switch transistor is turned on to conduct electrostatic charges on the first signal line to the second signal line, and the second switch transistor and the fourth switch transistor are turned on to conduct the electrostatic charges on the first signal line to the third signal line; and where a static voltage formed on the third signal line reaches a turn-on voltage, the third switch transistor and the fourth switch transistor are turned on to conduct electrostatic charges on the third signal line to the first signal line.

8. A display device comprising the electrostatic protection circuit of claim 1.

9. An electrostatic protection method for implementing electrostatic protection for a first signal line, a second signal line and a third signal line, the electrostatic protection method comprising:
connecting a gate electrode and a first electrode of a first switch transistor with the first signal line respectively, and connecting a second electrode of the first switch transistor with the second signal line;

connecting a gate electrode and a first electrode of a second switch transistor with the first signal line respectively, and connecting a second electrode of the second switch transistor with a gate electrode of a fourth switch transistor;

connecting a gate electrode and a first electrode of a third switch transistor with the third signal line respectively, and connecting a second electrode of the third switch transistor with the gate electrode of the fourth switch transistor;

connecting a first electrode of the fourth switch transistor with the third signal line, and connecting a second electrode of the fourth switch transistor with a second electrode of a fifth switch transistor and the gate electrode of the second switch transistor respectively; and connecting a gate electrode and a first electrode of the fifth switch transistor with the second signal line, and connecting the second electrode of the fifth switch transistor with the gate electrode of the second switch transistor;

wherein the first signal line and the second signal line are disposed adjacently to each other, and both the first signal line and the second signal line are scanning lines; or the first signal line and the second signal line are disposed adjacently to each other, and both the first signal line and the second signal line are data lines;

and wherein the third signal line is a common line or a short ring.

10. The electrostatic protection method of claim 9, wherein where a static voltage formed on the first signal line reaches a turn-on voltage, the first switch transistor is turned on to conduct electrostatic charges on the first signal line to the second signal line, and the second switch transistor and the fourth switch transistor are turned on to conduct the electrostatic charges on the first signal line to the third signal line;

where a static voltage formed on the second signal line reaches the turn-on voltage, the fifth switch transistor is turned on to conduct electrostatic charges on the second signal line to the first signal line, and the second switch transistor and the fourth switch transistor are turned on to conduct the electrostatic charges on the second signal line to the third signal line; and where a static voltage formed on the third signal line reaches the turn-on voltage, the third switch transistor and the fourth switch transistor are turned on to conduct electrostatic charges on the third signal line to the first signal line, and the second switch transistor is turned on to conduct the electrostatic charges on the third signal line to the first signal line.

11. The electrostatic protection method of claim 9, wherein in case the first switch transistor fails, where a static voltage formed on the first signal line reaches a turn-on voltage, the second switch transistor and the fourth switch transistor are turned on to conduct electrostatic charges on the first signal fine to the third signal line;

where a static voltage formed on the second signal line reaches the turn-on voltage, the fifth switch transistor is turned on to conduct electrostatic charges on the second signal fine to the first signal line, and the second switch transistor and the fourth switch transistor are turned on to conduct the electrostatic charges on the second signal line to the third signal line; and where a static voltage formed on the third signal line reaches the turn-on voltage, the third switch transistor and the fourth switch transistor are turned on to conduct electrostatic charges on the third signal line to the first signal line.

12. The electrostatic protection method of claim 9, wherein in case the second switch transistor fails, where a static voltage formed on the first signal line reaches a turn-on voltage, the first switch transistor is turned on to conduct electrostatic charges on the first signal line to the second signal line;

where a static voltage formed on the second signal line reaches the turn-on voltage, the fifth switch transistor is turned on to conduct electrostatic charges on the second signal line to the first signal line; and where a static voltage formed on the third signal line reaches the turn-on voltage, the third switch transistor and the fourth switch transistor are turned on to conduct electrostatic charges on the third signal line to the first signal line, and the first switch transistor is turned on to conduct the electrostatic charges on the third signal line to the second signal line.

13. The electrostatic protection method of claim 9, wherein in case the third switch transistor fails, where a static voltage formed on the first signal line reaches a turn-on voltage, the first switch transistor is turned on to conduct electrostatic charges on the first signal line to the second signal line, and the second switch transistor and the fourth switch transistor are turned on to conduct the electrostatic charges on the first signal line to the third signal line; and where a static voltage formed on the second signal line reaches the turn-on voltage, the fifth switch transistor is turned on to conduct electrostatic charges on the second signal line to the first signal line, and the second switch transistor and the fourth switch transistor are turned on to conduct the electrostatic charges on the second signal line to the third signal line.

* * * * *